(12) United States Patent
Lashley et al.

(10) Patent No.: US 7,687,775 B2
(45) Date of Patent: Mar. 30, 2010

(54) FERROELECTRIC INFRARED DETECTOR AND METHOD

(75) Inventors: Jason Charles Lashley, Sante Fe, NM (US); Cyril P. Opeil, Chestnut Hill, MA (US); James Lawrence Smith, Los Alamos, NM (US)

(73) Assignee: Los Alamos National Security, LLC, Los Alamos, NM (US)

( * ) Notice: Subject to any disclaimer, the term of this patent is extended or adjusted under 35 U.S.C. 154(b) by 76 days.

(21) Appl. No.: 11/961,815

(22) Filed: Dec. 20, 2007

(65) Prior Publication Data

US 2008/0185523 A1      Aug. 7, 2008

Related U.S. Application Data

(60) Provisional application No. 60/876,648, filed on Dec. 21, 2006.

(51) Int. Cl.
*G01J 5/10* (2006.01)
*G01J 5/02* (2006.01)

(52) U.S. Cl. .................. 250/338.2; 250/338.1; 374/177

(58) Field of Classification Search .............. 250/338.2; 374/176, 177
See application file for complete search history.

(56) References Cited

U.S. PATENT DOCUMENTS

| | | | |
|---|---|---|---|
| 4,080,532 A | * | 3/1978 | Hopper ........................ 250/332 |
| 4,516,027 A | * | 5/1985 | Schimmelpfennig et al. ..... 250/338.3 |
| 5,406,081 A | | 4/1995 | Inushima |
| 5,567,940 A | * | 10/1996 | Fang et al. ................ 250/338.2 |
| 6,580,077 B2 | | 6/2003 | Ito et al. |
| 7,038,206 B2 | | 5/2006 | Chen et al. |
| 2008/0246366 A1 | * | 10/2008 | Burgener et al. ............ 310/300 |

OTHER PUBLICATIONS

Hoshino, S., Mitsui, T., Jona, F., Pepinsky, R., Dielectric and Thermal Study of Tri-Glycine Sulfate and Tri-Glycine Flyoberyllate, Physical Review, Sep. 1, 1957, 107(5), pp. 1255-1258.

Ema, K. Hamano, K., Ikeda, Y., Critical Region in the Specific Heat of Ferroelectric TGS, J. Phys. Soc. Japan, Jan. 1979, 46(1), pp. 345-346.

Strukov, B.A., Ragula, E.P., Arkhangle'skaya, S.V., Shnaidshtein, I.V., Logarithmic singularity in the specific heat in the vicinity of phase transitions in the uniaxial ferroelectrics, Phys. Solid State, Jan. 1988, 40(1) pp. 94-95.

Mueller, H., Properties of Rochelle Salt, Physical Review, May 1, 1940, 57, pp. 829-839.

(Continued)

*Primary Examiner*—David P Porta
*Assistant Examiner*—Yara B Green
(74) *Attorney, Agent, or Firm*—Husch Blackwell Sanders LLP

(57) ABSTRACT

An apparatus and method are provided for sensing infrared radiation. The apparatus includes a sensor element that is positioned in a magnetic field during operation to ensure a λ shaped relationship between specific heat and temperature adjacent the Curie temperature of the ferroelectric material comprising the sensor element. The apparatus is operated by inducing a magnetic field on the ferroelectric material to reduce surface charge on the element during its operation.

9 Claims, 5 Drawing Sheets

OTHER PUBLICATIONS

Sullivan, P.F., Seidel, G., Steady-State, ac-Temperature Calorimetry, Physical Review, Sep. 15, 1968, 173(3), pp. 679-685.

Lawless, W.N., Origin of the T3/2 specific-heat term in triglycine sulfate at low temperatures, Physical Review B, Mar. 1, 1981, 23(5), pp. 2421-2424.

Lawless, W.N., Specific heats of paraelectrics, ferroelectrics, and antiferroelectrics at low temperatures, Physical Review B, Jul. 1, 1976, 14(1), pp. 134-143.

Fisher, M.E., Renormalization group theory: Its basis and formulation in statistical physics, Review of Modern Physics, Apr. 1998, 70(2), pp. 653-681.

Chynoweth, A.G., Dynamic Method for Measuring the Pyroelectric Effect with Special Reference to Barium Titanate, Journal of Applied Physics, Jan. 1956, pp. 78-84, 27-1.

Cooper, J., Minimum Detectable Power of a Pyroelectric Thermal Receiver, The Review of Scientific Instruments, Jan. 1962, pp. 92-95, 33-1.

Fuflyigin, V., Salley, E., Osinsky, A., and Norris, P., Pyroelectric Properties of AlN, Applied Physics Letters, Nov. 6, 2000, pp. 3075-3077, 77-19.

Hadni, A., Thomas, R., and Perrin, J., Response of a Triglycine Sulphate Pyroelctric Detector to High Frequencies (300 kHz), Journal of Applied Physics, Jun. 1969, pp. 2740-2745, 40-7.

Kinch, M., Fundamental Physics of Infrared Detector Materials, Journal of Electronic Materials, Jan. 5, 2000, pp. 809-817, 29-6.

Lashley, J.C., Opeil, C.P., Finlayson, T.R., Fisher, R.A., and Hur, N., Heat Capacity in Magnetic and Electric Fields Near the Ferroelectric Transition in Triglycine Sulfate, Applied Physics Letters, Dec. 21, 2006, pp. 052910-1-3; 90.

Lin, T., Meng, X.J., Sun, J.L., Ma, J.H., and Chu, J.H., Effect of LaNiO3 Buffer Layers on the Structure and Electrical Properties of sol-gel-derived Pb(Mg1/3NB2/3)O3-PbTiO3 thin films, Applied Physics A, Apr. 21, 2004, pp. 1025-1028, 81.

Ludlow, J.H., Mitchell, W.H., Putley, E.H., and Shaw, N, Infra-red radiation detection by the pyroelectric effect, J. Sci. Instrum., 1976, pp. 694-696, 44.

Soo Paik, D., Prasada Rao, A.V., and Komarneni, S., Ba Titanate and Barium/Strontium Titanate Thin Films from Hyrdoxide Presursors: Preparation and Ferroelectric Behavior, Journal of Sol-Gel Science and Technology, 1997, pp. 213-220, 10.

Rosenman, G., Shur, D., Skliar, A., Ferroelectric electron emission flat panel display, Journal of Applied Physics, May 1, 1996, pp. 7401-7403, 79-9.

White, D.J., Pyroelectric Response of Triglycine Sulfate to Amplitude-Modulated X-Band Signals, Journal of Applied Physics, Dec. 1964, pp. 3536-3542, 35-12.

Ramos, S., Del Cerro, J., Zamora, M. Specific Heat of Triglycine Sulfate at Several Applied Electric Fields near the Critical Temperature, Phys. Stat. Sol., 1980, pp. 307-313, 61.

Ema, K., Critical Behavior in the Heat Capacity of Ferroelectric TGC, TGSe, and TGFB, Journal of the Physical Society of Japan, Aug. 1983, 52, 8, pp. 2798-2809.

Catalan, G., Scott, J.F., Achilling, A., Gregg, J.M., Wall thickness dependence of the scaling law for ferroic stripe domains, J. Phys. Condens. Matter, 2007, 19, pp. 1-7.

Catalan, G., Magnetocapacitance without magnetoelectric coupling, Applied Physics Letter, Mar. 7, 2006, 88, pp. 102902-1-102902-3.

Lashley, J.C., et al., Critical examination of heat capacity measurements made on a Quantum Design physical property measurement system, Cryogenics, 2003, 43, pp. 369-378.

Matthias, B.T., Miller C.E., Remeika, J.P., Ferroelectricity of Glycine Sulfate, Sep. 11, 1956, pp. 849-850.

Gonzalo, J.A., Critical Behavior of Ferroelectric Triglycine Sulfate, Physical Review, Apr. 15, 1966, 144(2), pp. 662-665.

Gonzalo, J.A., Set of Experimental Critical Exponents for Ferroelectric Triglycine Sulfate, Physical Review Letters, Sep. 9, 1968, 21(11), pp. 749-751.

* cited by examiner

FERROELECTRIC INFRARED DETECTOR AND METHOD

CROSS REFERENCE TO RELATED APPLICATIONS

Applicant claims priority to Provisional Patent Application Ser. No. 60/876,648 filed Dec. 21, 2006 and incorporates the entire disclosure of the Provisional Patent Application herein by reference.

STATEMENT REGARDING FEDERAL RIGHTS

This invention was made with government support under contract number DE-AC52-06NA25396 awarded by the U.S. Department of Energy. The government has certain rights in the invention.

BACKGROUND OF INVENTION

Ferroelectric materials possess a net permanent dipole moment $\mu$. If the dipoles point in the same direction a spontaneous polarization, P, appears and the solid is called ferroelectric. The temperature T derivative of the polarization P, dP/dT is the pyroelectric coefficient. It is the pyroelectric coefficient, inherent to all ferroelectrics, that leads to an electrical charge or current at the surface of a solid that is a limitation of ferroelectric solids in sensor configurations. Today, sensors for detecting electromagnetic radiation are part of the mental furniture of researchers. They are typically tuned or constructed for sensing electromagnetic radiation within a specific wavelength, $\lambda$, of the electromagnetic spectrum. For example, they may be tuned for x-ray, ($10^{-6}$ to $10^{-8}$ cm), gamma ray, ($10^{-8}$ to $10^{-1}$ cm), infrared, ($10^{-2}$ to $10^{-4}$ cm). Devices using such technologies can be as simple as a household motion detector or memory devices to sophisticated astrophysics instruments and sophisticated instruments used in physics experiments. Infrared sensors are of particular interest and are used in high speed FTIR (Fourier Transform Infrared Spectroscopy), night vision instruments, particular those used by soldiers, astronomical telescopes and the like. Several types of sensors for detecting infrared radiation are known in the art. Some of these are discussed in U.S. Pat. No. 5,406,081. Of particular interest in this invention is the control of the pyroelectric current. In order to use the pyroelectric effect of the various ferroelectric materials, one needs to remove the surface charge on the sensor element. One way of doing this has been to enclose the sensor in a hermetically sealed area containing argon or neon gas (see U.S. Pat. No. 5,406,081). A window for transmitting the infrared radiation from the environment to the sensor is required and can be made from a material such as KBr or Teflon.

Surface charge, originating from dP/dT may also be reduced by the application of a layer of conductive material, e.g., polymer or metal, to the ferroelectric material. However, such requirements are expensive to implement and often adversely affect the performance.

Thus, there is a need for an improved sensor and method for assessing ferroelectric materials for functionality and critical parameters.

SUMMARY OF INVENTION

The present invention involves the provision of an infrared sensor apparatus that includes a sensor including at least one infrared sensitive element that includes a ferroelectric material. A magnetic field inducing device is associated with the element and is operable to induce a magnetic field on the ferroelectric material. The apparatus also includes a signal generating circuit associated with the element that is operable to generate a signal indicative of infrared radiation impinging on the sensor element.

The present invention also involves the provision of a method of sensing infrared radiation with improved efficiency. The method includes providing a sensor element including a ferroelectric material in a configuration effective to sense infrared radiation. A magnetic field is induced on the sensor element during an infrared sensing operation. The magnetic field is sufficient to reduce surface charges on the ferroelectric material by breaking the symmetry of the pyroelectric current an effective amount. An output signal is provided that is indicative of the impinging infrared radiation on the sensor element.

The present invention also involves the provision of a method of stringent testing ferroelectric materials. The method involves exposing a ferroelectric material to be tested to a magnetic field and measuring a property, particularly, the specific heat, polarization, and electrostriction in the vicinity of the ferroelectric transition. While the ferroelectric material is exposed to the magnetic field, it is tested for one or more properties which can include such things as specific heat.

BRIEF DESCRIPTION OF DRAWINGS

Like numbers and symbols throughout the various Figures illustrate like of similar parts and/or construction and/or variables.

DETAILED DESCRIPTION

Figure 1:
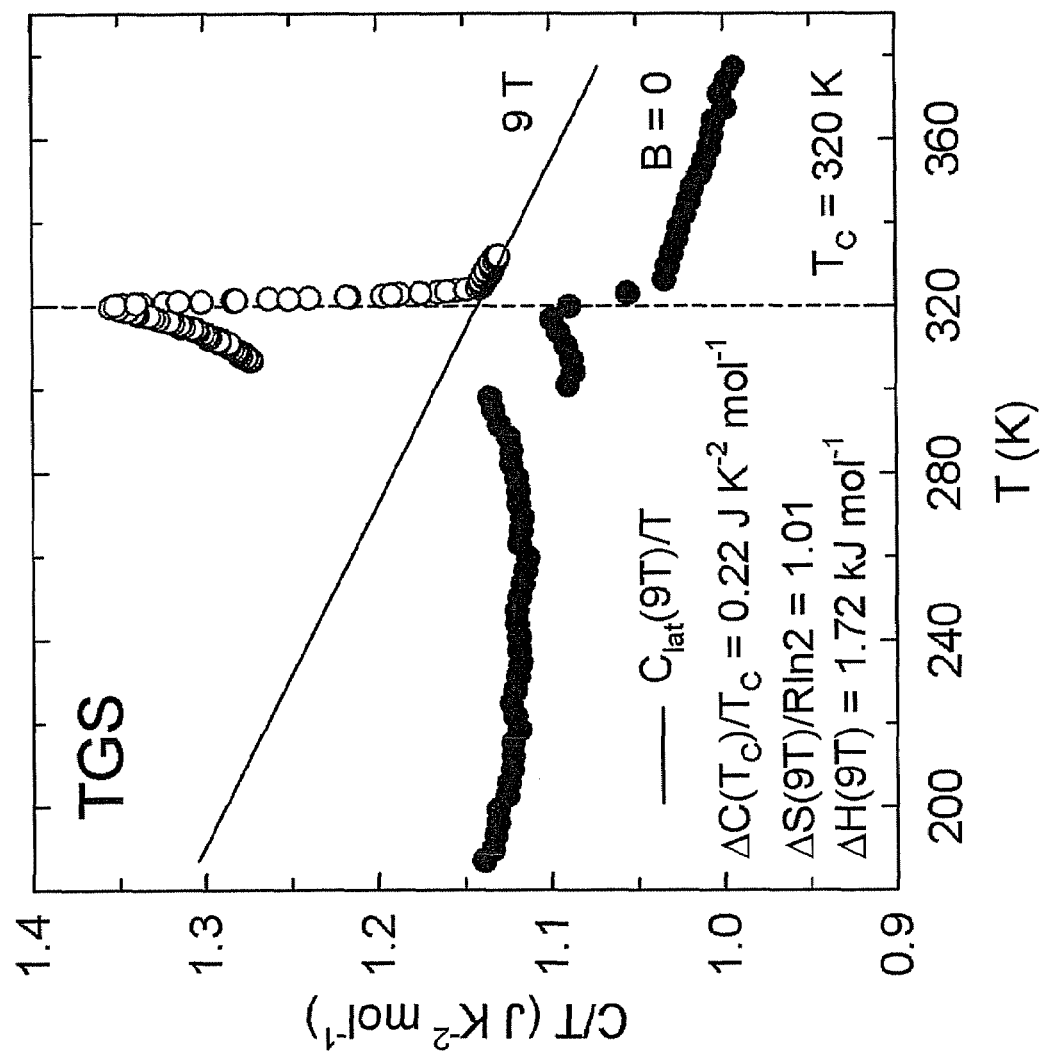
FIG. 1 is a graph showing functional relationships between temperature (T) and C/T (specific heat divided by temperature) with no magnetic field and a magnetic field of 9 T (Tesla) for tri-glycine sulfate which has a Curie temperature of about 320 K.

The discovery of a continuous-phase transition in try-glycine sulfate (TGS) $(CH_2NH_2CO_2H)_3 \cdot H_2SO_4$ showing the dielectric analog of ferromagnetism was made years ago. This transition was important in that critical exponents as determined from the electric polarization, P, and the dielectric constant, $\in$, are equal both above and below the Curie temperature $(T_C)$. Today, pyroelectric sensors based on ferroelectric materials like TGS have technological importance for detectors for infrared laser radiation and other devices. The sensitivity of such sensors originates from a large pyroelectric coefficient, dP/dT, low Curie temperature, $T_C=321.5$ K for TGS, and low coercive electric field, e.g., $E_C=220$ V/cm. Other ferroelectric materials have similar properties.

Although the critical exponents are well behaved above and below $T_C$ in P and E measurements, those obtained from specific heat measurements in the vicinity of $T_C$ have lent themselves to contradictory interpretations making property measurements and thus instrument design sometimes difficult. Adiabatic measurements made near $T_C$ on powdered TGS samples were puzzling because the specific heat anomaly for a continuous transition was not of the expected λ shape. Instead, the transition was thermally broadened giving an entropy change, $\Delta S=2$ J $K^{-1}$ $mol^{-1}$, (J=Joule, K=Kelvin) that was much less than the expected R ln 2 (R=universal gas constant). High-sensitivity ac measurements of the Seidel type made on a short-circuited crystal, showed a pronounced λ anomaly at $T_C$. High-precision ac measurements have been used to produce the λ anomaly and the specific-heat data were shown to depend logarithmically on (T-$T_C$). In a range where T-$T_C$ is ≦20 K above $T_C$.

In the low-temperature limit, specific-heat measurements demonstrate the surprising result that surface excitations, (up to 250 microns thick) cause a $T^{3/2}$ temperature dependence in the bulk heat capacity. It was therefore anticipated that because: (a) surface excitations are known to affect the bulk thermodynamic properties at low temperature giving rise to the $T^{3/2}$ term; (b) non-grounded powders do not give the expected λ anomaly at $T_C$; (c) ac measurements show a pronounced λ anomaly with a logarithmic critical fluctuation; and (d) high-precision adiabatic measurements show a smearing of the transition and do not have a logarithmic singularity surface excitation generated from the pyroelectric coefficient, dP/dT, were affecting the nature of the specific-heat anomaly near $T_C$. Experiments have shown that the non-grounded crystals in zero magnetic fields or zero electric fields show that the shape of the specific-heat anomaly near $T_C$ is thermally broadened, giving an entropy change smaller than the expected, R ln 2. However, it was surprisingly found that the shape of the anomaly changes into the characteristic λ shape expected for a continuous transition could be achieved with the application of a sufficient magnetic field giving an increased entropy change $\Delta S=5.8$ J $K^{-1}$ $mol^{-1}$=R ln 2. This can also be achieved by the application of an electric field. In crystals whose surface was short-circuited with gold, the characteristic λ shape appeared at $T_C$ with no applied magnetic or electric fields showing the equivalence between a short circuited material and those to which a magnetic or electric field have been applied.

The material used to produce the graphs in FIGS. 1-4 were TGS crystals grown from supersaturated solutions of the components by evaporation and were oriented by back-reflection Laue.

FIG. 1 shows the functional relationships between specific heat and temperature for samples with no magnetic field (solid black circles) and a magnetic field of 9 T (tesla) (open circles). It is clearly illustrated here that the use magnetic field induces a functional relationship having a λ shape at the Curie temperature ($T_C$). The sample that was not subjected to a magnetic field was not electrically grounded. FIG. 1 clearly shows the effect of a magnetic field on the critical parameters of the ferroelectric material TGS.

Figure 2:
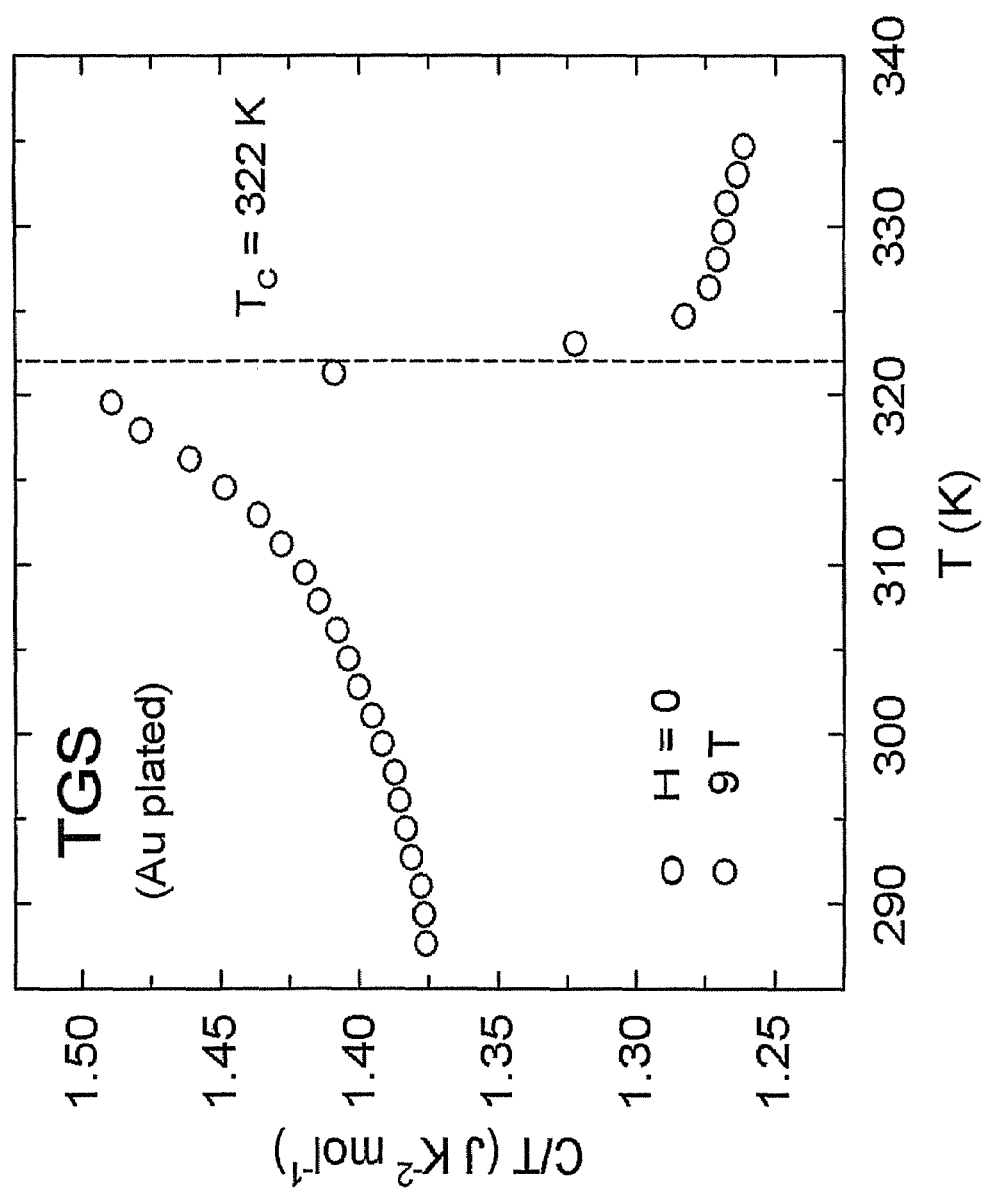
FIG. 2 is a graph illustrating functional relationships between C/T and temperature for two forms of a try-glycine sulfate sample, one sample being exposed to a magnetic field and one being coated with gold. The data points of both traces overlap so only one trace is illustrated.

FIG. 2 illustrates functional relationships for two samples, one, being exposed to a magnetic field of 9 T (which are the open circle data points) and a grounded sample i.e., the sample was grounded by plating the sample with gold, also illustratable by the open circle data points. This graph show the equivalence between grounding and the exposure of the sample to a magnetic field.

Figure 3:
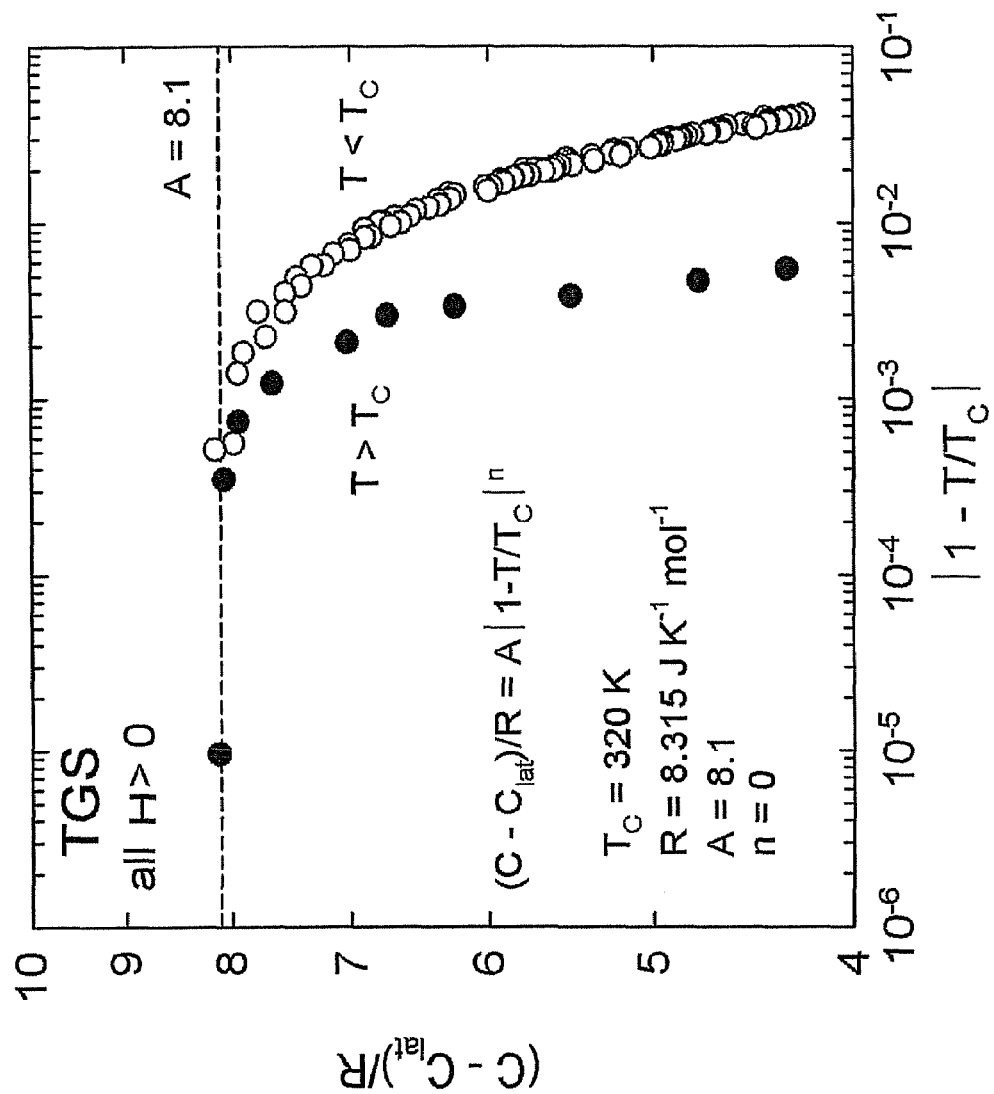
FIG. 3 is a log-log plot of excess heat capacity as a function of reduced temperature $(1-T/T_C)$. This represents a stringent examination of the thermodynamic order and critical phenomena of the transition.

FIG. 3 shows a log-log plot of the excess specific heat defined as the quantity (C-$C_{lat}$) ($C_{lat}$=lattice specific heat) normalized to the universal gas constant, R, versus reduced temperature, (1-T/$T_C$), on a log-log scale. The open circles illustrate data points obtained for data taken below $T_C$ while the solid circles show data points taken for temperatures above $T_C$.

Figure 4:
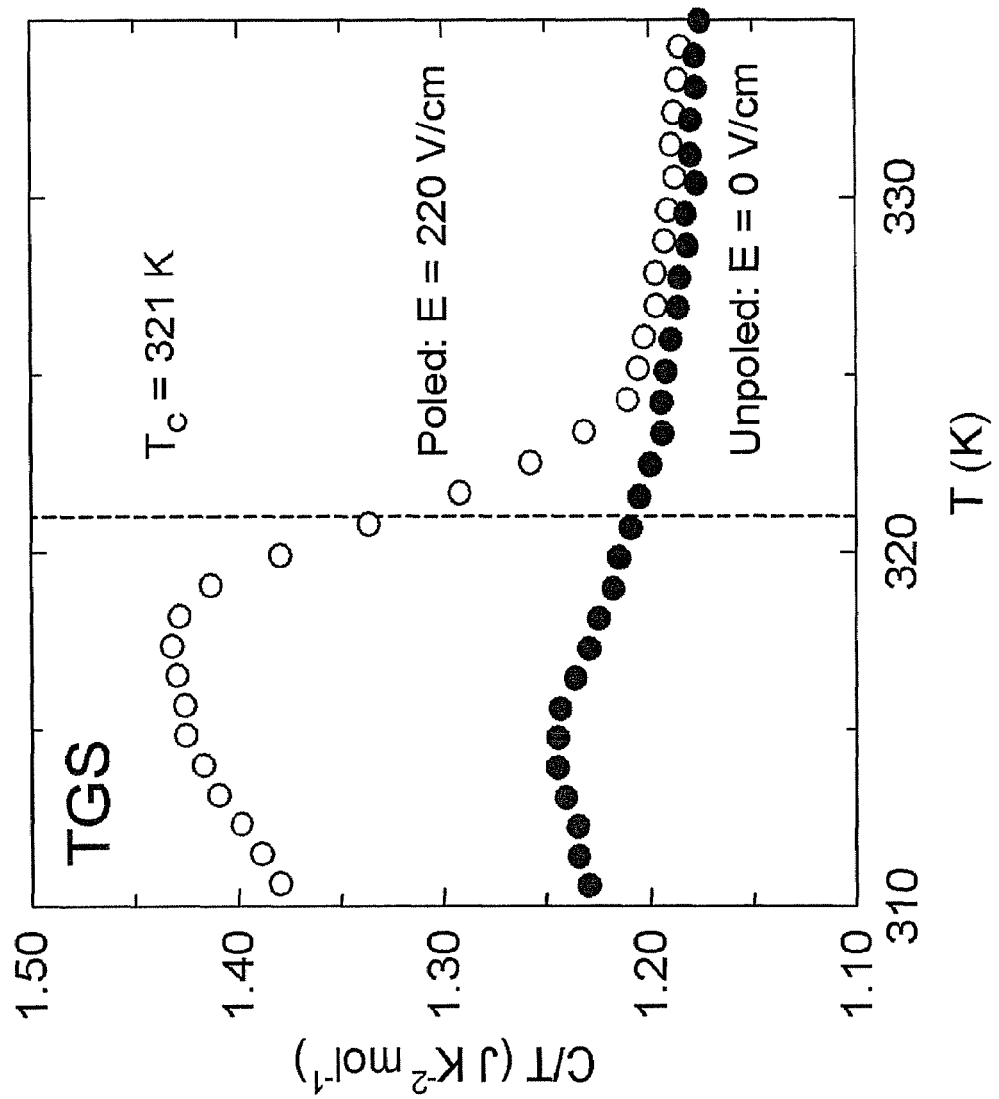
FIG. 4 is a graph showing functional relationships between C/T and temperature for two samples, one being exposed to an electric field and one not being exposed to an electric field.

FIG. 4 is a graph illustrating functional relationships between specific heat and temperature for a TGS sample exposed to an electric field of 220 V/cm (open circles) and for an ungrounded TGS sample that is not exposed to an electric field. This graph clearly shows the effect of an electric field on a TGS sample.

From the above discussed graphs, it is clear that surface charge on non-electrically grounded TGS crystals interacts with external magnetic and electric fields. The effect may be understood on the basis that the surface charge originating from the pyroelectric coefficient, dP/dT behaves as if shorted by the external field.

A more detailed discussion of the foregoing may be found in an article entitled *Heat Capacity In Magnetic and Electric Fields Near the Ferroelectric Transition in Try-Glycine Sulfate* by Lashley, et al. published in Applied Physics Letters 90, 052910 (2007) and the references cited therein.

Figure 5:
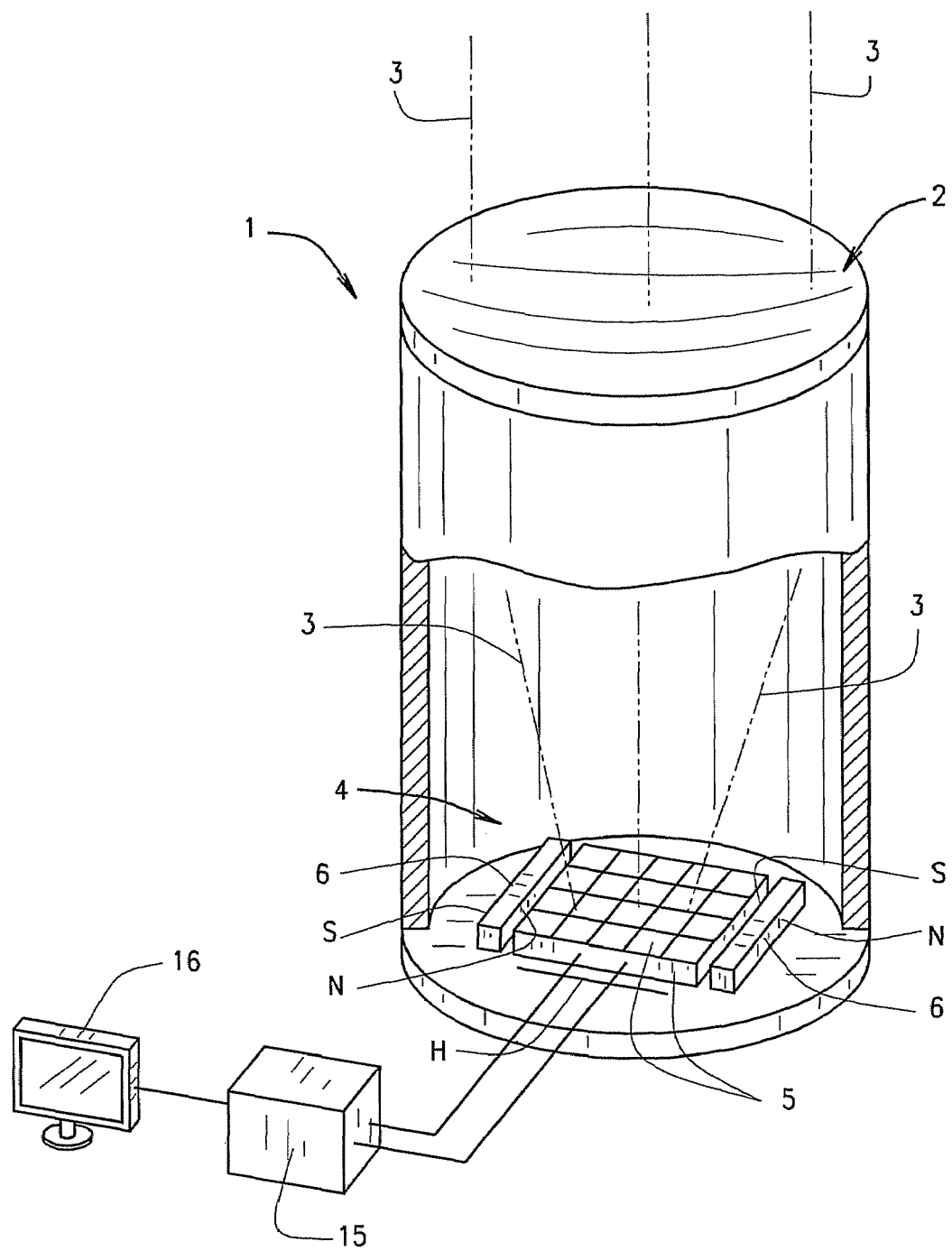
FIG. 5 is a schematic illustration of a sensor apparatus usable for detecting infrared radiation.

FIG. 5 schematically illustrates an apparatus for sensing infrared radiation and in particular far infrared radiation. Infrared radiation can be considered to have wave length in the range of between about $10^{-2}$ to about $10^{-4}$ cm. The sensing apparatus 1 includes, in a preferred embodiment, a lens structure 2 positioned to focus incident radiation 3 onto a sensor structure 4 including a sensor element 5 which can comprise a single element 5 or an array of elements 5. On opposite lateral sides of the sensor element(s) 5, there is provided a pair of magnets 6 to provide a magnetic field H with a field strength at least about 3 Tesla and preferably up to about 9 Tesla has been effective. The particular field strength will be determined by the specific ferroelectric material used, the sensitivity needed and its configuration in the sensor element. Suitable magnets 6 may include neodymium selenide, NdSe or a neodymium-iron-boron sintered composite, Nd—Fe—B, and have opposite polls (N(+), S(−)) facing inwards for example one north and one south facing inwardly to produce the stationary magnetic field H. Each individual element 5 may be provided with a pair of magnets 6 or the array may be provided with a pair of magnets or combinations thereof. The particular structure of sensor 4 will be determined by the size of the sensor, number of sensor elements 5 and the strength of the magnetic field needed. The lens 2 focuses the radiation 3 onto the sensor element(s) 5. If an array of sensor elements 5 is used, signals may be provided from each of the elements 5 to provide an image showing the distribution of infrared radiation by location within the image. The ferroelectric material used in the sensor elements 5 can be crystals or continuous layers as is known in the art. Controlling these pyroelectric currents arising from incident radiation or changes in the electric dipole moment is the primary concern.

The sensor 1 is provided with a signal generating circuit 15 associated with the infrared sensitive elements 5 and is operable to generate a signal indicative of infrared radiation impinging on the one or more elements 5. The signal can be used to generate an output in an output device 16 such as a picture on a display screen, or an analog or digital readout of a value indicating the intensity of the infrared radiation at one or more spots on the sensor. The output device may also provide an audio output such as an alarm or act as a switch to activate other equipment such as a data recorder. A composite picture may be generated for example to provide a thermal image of an item. The sensor 1 can be used for spectroscopy as is known in the art.

In a preferred embodiment, the ferroelectric material has a Curie temperature in the range of between about 290K and about 400K. The ferroelectric material can be try-glycine sulfate, or any other suitable ferroelectric materials including triglycine selenate, (TGSe) [$(CH_2NH_2CO_2H)*3SeO_4H_2$], triglycine fluorberylate, Rochelle salt [$NaKC_4H_4O_6*4H_2O$] or a relaxor ferroelectric.

The present invention can also be used as a method for testing for certain properties of an individual ferroelectric element or an array of ferroelectric elements by applying the above-described magnetic field and then conducting the desired property measurements. To test, an input variable is measured as well as a response variable while the element is exposed to a magnetic field of at least about 3 T. The response variable may also be used as a basis to calculate properties of the element. Such properties can include specific heat, polarization and electrostriction. Preferably during testing, at least for some period of time the temperature of the element is approximately at the Curie temperature of the ferroelectric material.

A method of sensing infrared radiation is provided by the present invention. The method includes providing a sensor element as described above that includes a ferroelectric material in a configuration effective to sense infrared radiation. It is preferred that the construction of the sensor eliminate the previously used windows and sealed chambers used in the past to reduce surface charges on the sensor element. A magnetic field H is induced in the sensor element and preferably has a magnetic field strength of least about 3 T (Tesla). The magnitude of the magnetic field is sufficient to reduce the surface charge on the element a sufficient amount to provide the desired output sensitivity. The output sensitivity will be determined by the specific use of the sensor apparatus. For example, a household motion detector can have a very low sensitivity while an astronomical telescope or a spectroscopic instrument would have a much higher need for sensitivity to infrared radiation. As previously discussed, the circuit provides an output signal indicative of the infrared radiation impinging on the sensor element which can then be transmitted to a displate of ice, for example, a digital readout, an analogue readout or a display screen for example, to illustrate a thermal image on the screen. Spectroscopic data may also be provided in the form of draft traces.

Thus, there has been shown and described several embodiments of a novel invention. As is evident from the foregoing description, certain aspects of the present invention are not limited by the particular details of the examples illustrated herein, and it is therefore contemplated that other modifications and applications, or equivalents thereof, will occur to those skilled in the art. The terms "having" and "including" and similar terms as used in the foregoing specification are used in the sense of "optional" or "may include" and not as "required". Many changes, modifications, variations and other uses and applications of the present invention will, however, become apparent to those skilled in the art after considering the specification and the accompanying drawings. All such changes, modifications, variations and other uses and applications which do not depart from the spirit and scope of the invention are deemed to be covered by the invention which is limited only by the claims which follow.

The invention claimed is:

1. An infrared sensor apparatus including:
   a sensor including at least one infrared sensitive element including a ferroelectric material;
   a magnetic field inducing device associated with the at least one element and operable to induce a magnetic field with a magnitude of at least about 3T on the ferroelectric material; and
   a signal generating circuit associated with the element operable to generate a signal indicative of infrared radiation impinging on the at least one said element.

2. The sensor apparatus of claim 1 wherein the ferroelectric material having a Curie temperature of less than about 400K.

3. The sensor apparatus of claim 2 wherein the material including tri-glycine sulfate.

4. The sensor apparatus of claim 1 wherein the sensor including an array of said at least one element.

5. The sensor apparatus of claim 4 wherein the sensor including a lens system operable to receive IR radiation and to project received IR radiation onto the array.

6. A method of sensing infrared radiation, the method including:
   providing a sensor element including a ferroelectric material in a configuration effective to sense infrared radiation;
   inducing a magnetic field on said sensor element, the field having a magnitude sufficient to reduce surface charge on the sensor element an effective amount; and
   providing an output signal indicative of infrared radiation impinging on the sensor element.

7. The method of claim 6 wherein the magnetic field having a magnitude of at least about 3T.

8. The method of claim 7 wherein the ferroelectric material having a Curie temperature of less than about 400K.

9. The method of claim 6 wherein the surface charge being reduced an amount wherein the ferroelectric material having a L shaped specific heat anomaly at about its Curie temperature.

* * * * *